United States Patent
Yuzawa et al.

(10) Patent No.: US 7,598,730 B2
(45) Date of Patent: *Oct. 6, 2009

(54) SEMICONDUCTOR WAFER EXAMINATION METHOD AND SEMICONDUCTOR CHIP MANUFACTURING METHOD

(75) Inventors: Hideki Yuzawa, Iida (JP); Kazuhiro Kijima, Fujimi (JP)

(73) Assignee: Seiko Epson Corporation (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/775,278

(22) Filed: Jul. 10, 2007

(65) Prior Publication Data

US 2007/0259458 A1    Nov. 8, 2007

Related U.S. Application Data

(62) Division of application No. 11/458,781, filed on Jul. 20, 2006, now abandoned.

(30) Foreign Application Priority Data

Jul. 25, 2005   (JP) .............................. 2005-214218

(51) Int. Cl.
G01R 31/28   (2006.01)
G01R 31/26   (2006.01)
H01L 21/66   (2006.01)

(52) U.S. Cl. .................. 324/158.1; 324/765; 438/14
(58) Field of Classification Search ......... 324/752–765; 438/10–11, 14–17

See application file for complete search history.

(56) References Cited

U.S. PATENT DOCUMENTS

| | | | |
|---|---|---|---|
| 5,346,861 A * | 9/1994 | Khandros et al. | 438/15 |
| 5,532,610 A | 7/1996 | Tsujide et al. | |
| 5,556,810 A * | 9/1996 | Fujitsu | 438/118 |
| 6,048,750 A * | 4/2000 | Hembree | 438/107 |
| 6,091,475 A * | 7/2000 | Ogino et al. | 349/149 |
| 6,219,908 B1 * | 4/2001 | Farnworth et al. | 29/833 |
| 6,383,825 B1 * | 5/2002 | Farnworth et al. | 438/14 |
| 6,605,522 B1 * | 8/2003 | Ezawa et al. | 438/613 |
| 7,160,797 B2 * | 1/2007 | Beatson | 438/617 |
| 7,279,919 B2 * | 10/2007 | Volkerink et al. | 324/765 |
| 2003/0189439 A1 | 10/2003 | Kohno et al. | |
| 2004/0070413 A1 | 4/2004 | Kasukabe et al. | |

FOREIGN PATENT DOCUMENTS

| | | | |
|---|---|---|---|
| JP | 57-87145 | 5/1982 | |
| JP | 59023530 A * | 2/1984 | 438/17 |
| JP | 363086541 | 4/1988 | |
| JP | 5-283490 | 10/1993 | |
| JP | 2003-309050 | 10/2003 | |

* cited by examiner

*Primary Examiner*—Ha Tran T Nguyen
*Assistant Examiner*—Joshua Benitez
(74) *Attorney, Agent, or Firm*—Harness, Dickey & Pierce, P.L.C.

(57) ABSTRACT

A semiconductor wafer examination method that includes: preparing a wafer formed with a chip area for use as a semiconductor chip; firstly examining the wafer by probing; pressing an electrode of the wafer with a pressure member having a flat surface; and secondly examining the wafer by probing.

30 Claims, 2 Drawing Sheets

SEMICONDUCTOR WAFER EXAMINATION METHOD AND SEMICONDUCTOR CHIP MANUFACTURING METHOD

CROSS-REFERENCE TO RELATED APPLICATIONS

This application is a divisional of U.S. patent application Ser. No. 11/458,781 filed on Jul. 20, 2006, which claims the benefit of Japanese Patent Application No.2005-214218, filed Jul. 25, 2005. The disclosures of the above applications are incorporated herein by reference.

BACKGROUND

1. Technical Field

The present invention relates to a semiconductor wafer examination method by wafer probing, and a semiconductor chip manufacturing method.

2. Related Art

In the process of manufacturing a semiconductor chip, a semiconductor wafer formed with a plurality of semiconductor chips is subjected to an electric examination on a semiconductor chip basis so that screening is performed to find any defective piece. Such an examination includes a probe examination by probing. After the wafer is subjected to the probe examination, the wafer is generally diced so that chips are formed. This thus may cause a failure to some semiconductor devices of the semiconductor chips if heat and pressure act on the electrodes of the semiconductor chips in the subsequent process of semiconductor chip implementation, for example. With the previous general semiconductor chip manufacturing method, such a failure detection is no sooner than semiconductor chip implementation, e.g., during the package check.

SUMMARY

An advantage of some aspects of the invention is to provide a semiconductor wafer examination method with which screening is performed at an earlier stage with high accuracy to find any possible failure.

Another advantage of some aspects of the invention is to provide a semiconductor chip manufacturing method using the examination method of the invention.

The invention is directed to a semiconductor wafer examination method that includes: a step of preparing a wafer formed with a chip area for use as a semiconductor chip; a first probe examination in which the wafer is examined by probing; a step of pressing an electrode of the wafer with a pressure member having a flat surface; and a second probe examination in which the wafer is examined by probing.

With such a semiconductor wafer examination method according to some aspects of the invention, any failure that is highly likely to occur to a semiconductor wafer, e.g., at the time of semiconductor chip implementation, can be detected in advance so that screening can be performed with better reliability. This favorably leads to the reduction of failure occurrence so that the resulting semiconductor chip can be high in reliability.

With the semiconductor wafer examination method according to some aspects of the invention, in the step of pressing the electrode, the electrode can be heated.

With the semiconductor wafer examination method according to some aspects of the invention, in the step of pressing the electrode, an upper surface of the electrode can be made flat.

With the semiconductor wafer examination method according to some aspects of the invention, the pressure member can use a bonding tool.

With the semiconductor wafer examination method according to some aspects of the invention, in the chip area, a semiconductor device can be formed below the electrode.

The invention is also directed to a semiconductor chip manufacturing method that includes: a step of preparing a wafer formed with a chip area for use as a semiconductor chip; a first probe examination in which the wafer is examined by probing; a step of pressing an electrode of the wafer with a pressure member having a flat surface; a second probe examination in which the wafer is examined by probing; and a step of forming the semiconductor chip by dicing the wafer.

With the semiconductor chip manufacturing method according to some aspects of the invention, the resulting semiconductor chip manufactured by such an examination method can be less likely to cause a failure.

BRIEF DESCRIPTION OF THE DRAWINGS

The invention will be described with reference to the accompanying drawings, wherein like numbers reference like elements.

DESCRIPTION OF EXEMPLARY EMBODIMENT

Figure 1:
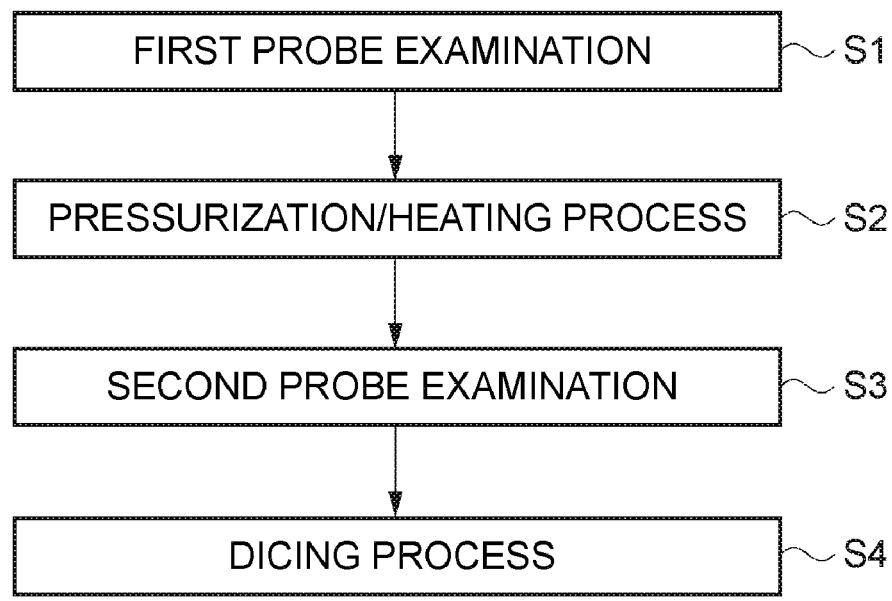
FIG. 1 is a diagram showing the procedure in an embodiment of the invention.
Figure 2:
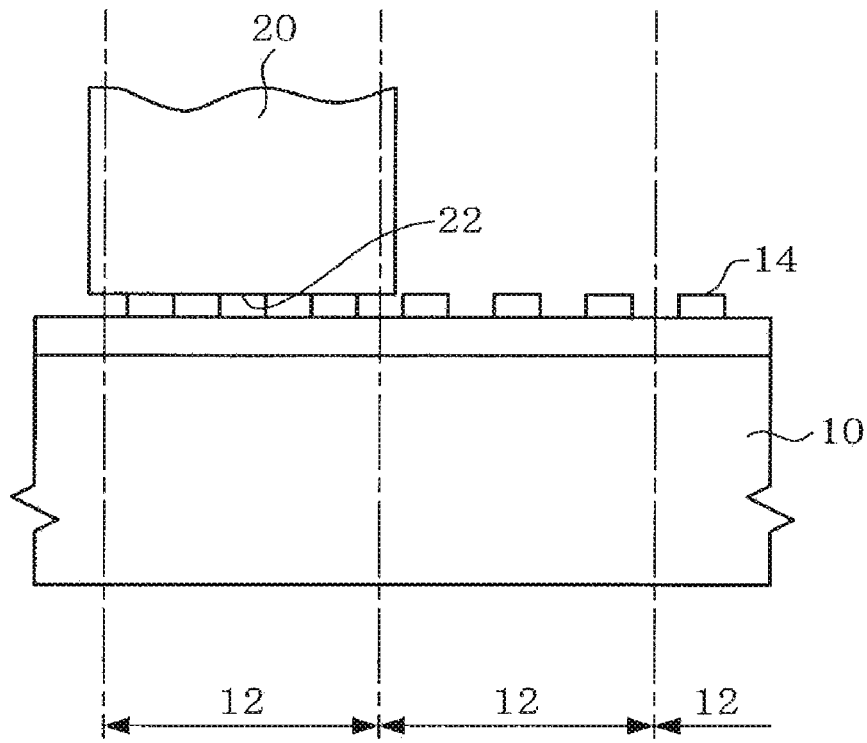
FIG. 2 is a diagram showing process operations in the embodiment of the invention.
Figure 3:
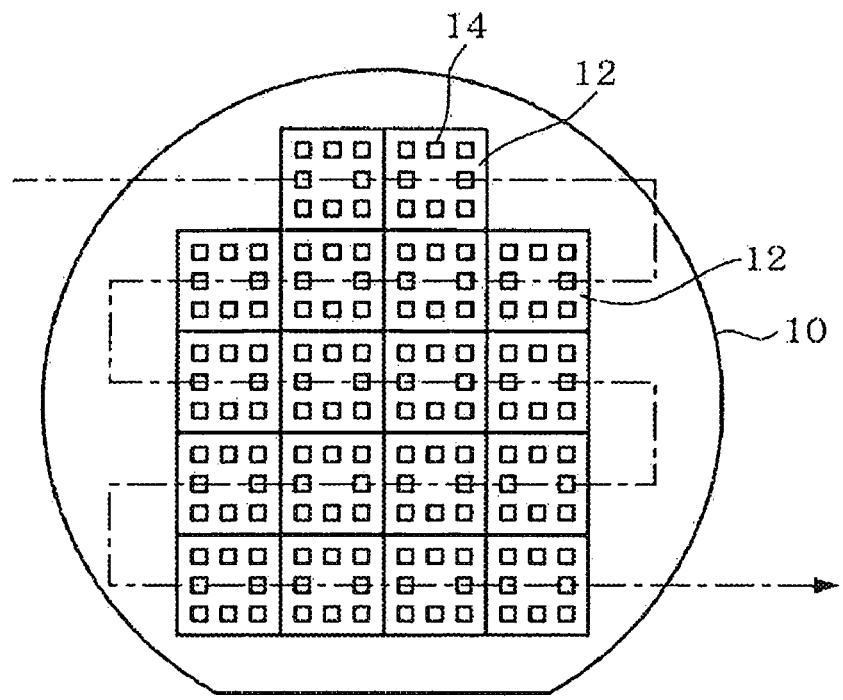
FIG. 3 is another diagram showing the process operations in the embodiment of the invention.
Figure 4:
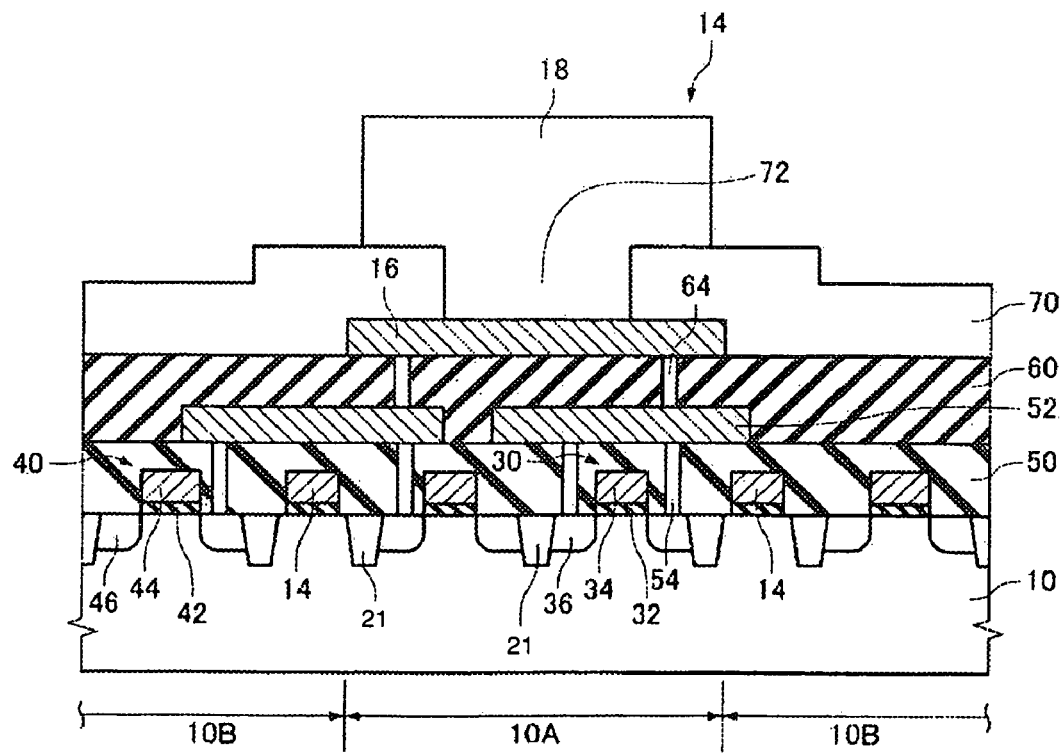
FIG. 4 is a diagram showing the partial configuration of a semiconductor wafer in the embodiment of the invention.

In the below, an exemplary embodiment of the invention is described by referring to the accompanying drawings. FIG. 1 is a diagram for illustrating a semiconductor wafer examination method of the embodiment. FIG. 2 is a cross sectional diagram schematically showing a process of the semiconductor wafer examination method. FIG. 3 is a schematic plan view of a wafer being an examination object. FIG. 4 is a schematic cross sectional view of a part of a chip area.

In the embodiment, a wafer is prepared for examination use. As shown in FIGS. 2 and 3, this wafer is configured by a semiconductor substrate 10 formed with a plurality of chip areas 12, which serve as semiconductor chips after wafer dicing. The chip areas 12 are provided with an integrated circuit that is not shown. The integrated circuit is not specifically defined by configuration, and may include an active element such as transistor or a passive element such as resistor, coil, or capacitor.

The chip areas 12 are each provided with electrodes 14 for connection use. The electrode 14 can be electrically connected to the inside of each corresponding chip area 12. The term electrode 14 may include any other electrodes not electrically connected to the chip areas 12. As shown in FIG. 4, the electrode 14 may be configured to include a pad 16, and a bump 18 formed on the pad 16. With this being the case, the bump 18 may be a gold bump, or a nickel bump with gold plating.

The wafer is examined in the procedure of FIG. 1.

a. The wafer is first examined using a probe device by probing, i.e., a first probe examination (S1). The probe examination is not specifically defined in manner, and any known technique will be adopted. As an exemplary probe examination, as shown in FIG. 3, the electrodes 14 formed to the chip areas 12 of the semiconductor wafer are brought in contact with a probe needle of a probe card for voltage application of a predetermined level from the probe needle. The chip areas 12 are then examined electrically using a tester, e.g., continuity test. In such a probe examination, the probe needle is brought in contact with the electrodes 14 on the basis of the chip area 12 or of a plurality of chip areas 12 so that the chip areas 12 can be examined sequentially as indicated by an arrow of FIG. 3, for example.

b. The electrodes 14 of the wafer are then pressed with a pressure member (S2). In this process, as shown in FIG. 2, a pressure member 20 having a flat surface 22 is moved downward with the flat surface 22 facing down, and the flat surface 22 is brought in contact with the upper surfaces of the electrodes 14. The pressure member 20 is then moved downward again to press the electrodes 14 for application thereto of a predetermined level of pressure. If a user wants to check the influence as a result of heating of the electrodes 14, the electrodes are to be pressed while the pressure member 20 is being heated.

For example, when a semiconductor chip is mounted on a substrate, generally, the electrodes 14 are pressed against the wiring section of the substrate while being heated using a bonding tool. If a user wants to check the resulting influence, the electrodes 14 may be pressed and heated in the process b with more strict requirements for implementation so that the influence can be checked with better reliability.

For example, for reference purposes, described now are exemplary requirements for COG (Chip On Glass) implementation and for the process h. Note here that these requirements share the same moving-down speed of the pressure member 20 and the time for the pressing operation.

|  | COG | Process b |
| --- | --- | --- |
| Load on Electrodes 14 | 30 MPa | 45 MPa |
| Temperature of Electrodes 14 | 300 degrees or lower | 300 to 350 degrees |

The pressurization/heating operation in the process b can be applied on the basis of the chip area 12 or of a plurality of chip areas 12. After the process b, the bump 18 of each of the electrodes 14 is made flat on the upper surface.

The pressure member 20 is not specifically restrictive as long as being adjustable at least for pressurization, preferably, being adjustable for both pressurization and heating. The pressure member 20 may serve also as a bonding tool for use for a collective connection between the wiring section of the substrate and the electrodes of the semiconductor chips.

c. The wafer is then examined by probing, i.e., a second probe examination (S3), similarly to the first probe examination. This probe examination enables to detect any failure occurred as a result of the probe examination, i.e., in the pressurization operation in the process b, or the pressurization/heating operation therein.

The examination technique of this embodiment is applicable to a semiconductor wafer with semiconductor chips of a general type. The examination technique is useful also to examine a semiconductor wafer including a semiconductor unit of the following type.

As shown in FIG. 4, the semiconductor device is formed with semiconductor devices such as MIS (Metal Insulator Semiconductor) transistor 30 also below the electrode 14. More specifically, in this semiconductor unit, the semiconductor substrate 10 is formed with a device isolation insulation layer 21. The device isolation insulation layer 21 can be formed by STI (Shallow Trench Isolation), LOCOS (Local Oxidation of Silicon), semi-recessed LOCOS, and others. The device isolation insulation layer 21 FIG. 4 is the one formed by STI. In an area 10A directly below the electrode 14, the MIS transistor 30 is formed. Also in an area 10B not directly below the electrode 14, an MIS transistor 40 is provided similarly to the area 10A. The MIS transistor 30 is configured to include a gate insulation layer 32, a gate electrode 34 provided on the gate insulation layer 32, and an impurity region 36 formed to the semiconductor substrate 10. The impurity region 36 serves as a source or drain region. The MIS transistor 40 is configured similarly to the MIS transistor 30, including a gate insulation layer 42, a gate electrode 44, and an impurity region 46. The gate electrodes 34 and 44 are each configured by a polysilicon layer, a polycide layer, or others. Although not shown in FIG. 4, the MIS transistors 30 and 40 may each include a sidewall insulation layer. In FIG. 4, a reference numeral 14 denotes a wiring layer.

Over the MIS transistors 30 and 40, inter-layer insulation layers 50 and 60 are so formed in this order as to cover the MIS transistors 30 and 40. The inter-layer insulation layers 50 and 60 are each made of a known general material. On the inter-layer insulation layer 50, a wiring layer 52 of a predetermined pattern is formed, and an electrical connection is established by a contact layer 54 between the wiring layer 52 and the impurity region 36 of the MIS transistor 30.

The inter-layer insulation layer 60 is formed thereon with the pad 16. The pad 16 establishes an electrical connection by the wiring layer 52 and a contact layer 64. The pad 16 is formed by a metal such as aluminum or copper. The semiconductor unit may be also formed with a passivation layer 70, which is formed with an aperture 72 from which at least a part of the pad 16 is exposed. The aperture 72 may be so formed as to expose therefrom only the center portion of the pad 16. That is, the passivation layer 70 may be so formed as to cover the peripheral portion of the pad 16. The passivation layer 70 may be formed by $SiO_2$, SiN, polyimide resin, or others.

The aperture 72 is formed with the bump 18, i.e., the bump 18 is formed on the exposure surface of the pad 16. In this semiconductor unit, the bump 18 is so formed as to reach over the passivation layer 70. The bump 18 is formed by a single or a plurality of layers, and is made of a metal such as gold, nickel, or copper. The bump 18 is not specifically defined by outer shape, and may be formed rectangular (including square and rectangle), or formed circular. The outer dimension of the bump 18 may be smaller than that of the pad 16. With this being the case, the bump 18 may be formed only in an area overlapping the pad 16.

Although not shown, a barrier layer may be formed at the bottom of the bump 18. The barrier layer may serve to prevent material dissipation for both the pad 16 and the bump 18. The barrier layer may be formed by a single or a plurality of layers, and may be formed by sputtering. The barrier layer may be also made to improve the adhesion between the pad 16 and the bump 18. The barrier layer may include a titanium tungsten (TiW) layer. When such a barrier layer is formed by a plurality of layers, the top surface of the barrier layer may be an electroplated metal layer, e.g., Au layer, for deposition of the bump 18.

With such a semiconductor unit as shown in FIG. 4, because the MIS transistor 30 is formed below the electrode 14, if the electrode 14 is pressurized and heated when being connected to any other component, not only the electrode 14 but also the components therebelow are affected thereby. As a result, this easily leads to failures of the devices compared with a case where the electrode 14 is formed therebelow with no device such as MIS transistor. With the examination method of this embodiment, however, the processes b and c enable to detect failures being highly likely to occur as a result of semiconductor chip implementation even prior to the implementation. This is surely applicable to a case where no MIS transistor is formed below the electrode 14.

After such an examination method, the wafer is diced by any known dicing technique so that semiconductor chips can be formed.

According to the embodiment, the following effects can be characteristically achieved.

First of all, with the examination method of the embodiment, any failures that are highly likely to occur as a result of semiconductor chip implementation can be detected beforehand, e.g., in the form of semiconductor wafer, so that screening can be performed with better reliability with respect to the resulting semiconductor chips. This favorably reduces the failure frequency of the semiconductor chips for use, and the resulting semiconductor chips can be increased in reliability. Such characteristics are considered advantageous especially with a semiconductor wafer in which devices such as MIS transistors are formed below the electrodes.

Secondly, with the examination method of the embodiment, in the process b, the upper surfaces of the electrodes 14 are pressed, preferably, pressed and heated so that the upper surface of the bump 18 of each of the electrodes 14 can be made flat. As such, in the resulting semiconductor chips, the bump 18 can be flat enough, and the electrodes 14 are highly reliable in terms of connection.

While the invention has been described in detail, the foregoing description is in all aspects not restrictive, and it is understood that numerous other modifications and variations can be devised. For example, the invention includes any configuration substantially the same as the configurations described in the embodiment, e.g., configurations leading to the same functions, methods, and results, or configurations leading to the same objects and effects. The invention also includes any configuration in which a component(s) are changed if not essential. The invention also includes any configuration leading to the same effects or achieving the same objects as those described in the embodiment. The invention also includes any configuration in which any known technique is taken into consideration for the configurations described in the embodiment.

What is claimed is:

1. A method of inspecting a semiconductor wafer, the method comprising:
   firstly inspecting the semiconductor wafer by firstly probing;
   pressing the semiconductor wafer at a first pressure; and
   secondly inspecting the semiconductor wafer by secondly probing,
   the semiconductor wafer having a chip that includes a transistor and an electrode,
   the chip being mounted at a second pressure after being diced from the semiconductor wafer,
   the first pressure being higher than the second pressure,
   the secondly inspecting being carried out to determine whether the failure is likely to occur when the chip is mounted at the second pressure that is lower than the first pressure.

2. The method according to claim 1,
   the semiconductor chip including a transistor; and
   the electrode being disposed above a part of the transistor.

3. The method according to claim 1, the semiconductor chip including a transistor; and the electrode being disposed above an entire surface of the transistor.

4. The method according to claim 1,
   the electrode including at least a pad.

5. The method according to claim 1, the electrode including a pad and a bump, the bump being formed on the pad.

6. The method according to claim 5,
   the pad including aluminum or copper; and
   the bump including gold or nickel.

7. The method according to claim 1,
   the firstly inspecting being conducted by using a first probe card; and the secondly inspecting being conducted by using a second probe card.

8. The method according to claim 1,
   the mounting being done by a pressure member or a bonding tool.

9. The method according to claim 8,
   an upper surface of the electrode being made flat by the pressure member or the bonding tool.

10. The method according to claim 1,
    the first pressure being about 45 MPa; and
    the second pressure being about 30 MPa.

11. The method according to claim 1, the chip being mounted on glass.

12. The method according to claim 1,
    the firstly inspecting is conducted by using a probe card.

13. The method according to claim 1,
    the secondly inspecting is conducted by using a probe card.

14. A method of manufacturing a semiconductor chip comprising the method as defined by claim 1.

15. A method of inspecting a semiconductor wafer, comprising:
    a.) firstly inspecting one of a plurality of chips in the wafer by firstly probing;
    b.) pressing an electrode on the semiconductor wafer at a first pressure;
    c.) secondly inspecting the semiconductor wafer by secondly probing,
    d.) each of the plurality of chips being mounted at a second pressure after being diced from the wafer,
    e.) the first pressure being higher than the second pressure, and
    f.) the secondly inspecting step being carried out to determine whether a failure occurs in the semiconductor wafer by the pressing of the electrode.

16. The method according to claim 15,
    the semiconductor chip including a transistor; and
    the bumped electrode being disposed above a part of the transistor.

17. The method according to claim 15,
    the semiconductor chip including a transistor; and the electrode being disposed above an entire surface of the transistor.

18. The method according to claim 15,
    the electrode including at least a pad.

19. The method according to 15, the electrode including a pad and a bump, the bump being formed on the pad.

20. The method according to claim 19,
    the pad including aluminum or copper; and
    the bump including gold or nickel.

21. The method according to claim 15,
    the firstly inspecting being conducted by using a first probe card; and the secondly inspecting being conducted by using a second probe card.

22. The method according to claim 15, the mounting being done by a pressure member or a bonding tool.

23. The method according to claim 22, an upper surface of the electrode being made flat by the pressure member or the bonding tool.

24. The method according to claim 15, the first pressure being about 45 MPa; and the second pressure being about 30 MPa.

25. The method according to claim 24, wherein step further comprises pressing the wafer with a heated device.

26. The method according to claim 15, the chip being mounted on glass.

27. The method according to claim 15, the firstly inspecting is conducted by using a probe card.

28. The method according to claim 15, the secondly inspecting is conducted by using a probe card.

29. A method of manufacturing a semiconductor chip comprising the method as defined by claim 15.

30. A method of inspecting a semiconductor wafer having a plurality of chips therein with a bumped electrode located above a transistor, the chips being mounted at a first pressure after being diced from the wafer, the method comprising:

firstly inspecting the semiconductor wafer by firstly probing;

pressing the electrode at a second pressure higher than the first pressure;

secondly inspecting the semiconductor wafer by secondly probing; and detecting whether a failure by the pressing of the electrode has occurred or not.

* * * * *